(12) United States Patent
Davies et al.

(10) Patent No.: US 12,141,506 B2
(45) Date of Patent: Nov. 12, 2024

(54) METHOD FOR GENERATING PREDICTIVE CHANCE MAPS OF PETROLEUM SYSTEM ELEMENTS

(71) Applicant: Landmark Graphics Corporation, Houston, TX (US)

(72) Inventors: Andrew Davies, West Hagbourne (GB); Benjamin Yves Gréselle, Didcot (GB)

(73) Assignee: LANDMARK GRAPHICS CORPORATION, Houston, TX (US)

( * ) Notice: Subject to any disclaimer, the term of this patent is extended or adjusted under 35 U.S.C. 154(b) by 653 days.

(21) Appl. No.: 16/795,279

(22) Filed: Feb. 19, 2020

(65) Prior Publication Data

US 2020/0184134 A1 Jun. 11, 2020

Related U.S. Application Data

(63) Continuation of application No. PCT/US2018/031672, filed on May 8, 2018.

(51) Int. Cl.
*G06F 30/20* (2020.01)
*G06F 18/2135* (2023.01)
(Continued)

(52) U.S. Cl.
CPC .......... *G06F 30/20* (2020.01); *G06F 18/2135* (2023.01); *G06F 30/27* (2020.01); *G06N 20/00* (2019.01); *G16Y 20/10* (2020.01)

(58) Field of Classification Search
CPC ....... G06F 30/27; G06F 30/20; G06K 9/6247; G06N 20/00; G16Y 20/10; G01V 99/005; G06Q 10/04; G06Q 10/06; G06Q 50/02
See application file for complete search history.

(56) References Cited

U.S. PATENT DOCUMENTS

| 7,480,640 B1 * | 1/2009 | Elad | G06Q 10/10 706/14 |
| 2008/0021656 A1 * | 1/2008 | Saenger | G01V 1/28 702/16 |

(Continued)

FOREIGN PATENT DOCUMENTS

| CN | 101512556 A | * | 8/2009 | ............... G01V 1/34 |
| CN | 103527184 B | * | 4/2016 | |

(Continued)

OTHER PUBLICATIONS

International Search Report & Written Opinion in International Application No. PCT/US2018/031672, mailed Feb. 8, 2019.

(Continued)

*Primary Examiner* — Kandasamy Thangavelu
(74) *Attorney, Agent, or Firm* — Barnes & Thornburg LLP

(57) ABSTRACT

A non-transitory computer readable medium includes a set of instructions that in operation cause a processor to determine at least one modelled parameter of a feature of interest in petroleum exploration. The instructions also cause a processor to assign a likelihood value to each modelled parameter of the at least one modelled parameter and to generate an initial chance map for each modelled parameter of the at least one modelled parameter. Further, the instructions cause a processor to assign a weighting factor for each modelled parameter of the at least one modelled parameter, (Continued)

and to combine the initial chance maps using the weighting factor for each modelled parameter of the at least one modelled parameter to generate a first simulation chance map.

20 Claims, 4 Drawing Sheets

(51) Int. Cl.
*G06F 30/27* (2020.01)
*G06N 20/00* (2019.01)
*G16Y 20/10* (2020.01)

(56) References Cited

U.S. PATENT DOCUMENTS

| | | | |
|---|---|---|---|
| 2009/0020284 A1* | 1/2009 | Graf | E21B 44/00 166/250.15 |
| 2009/0306895 A1* | 12/2009 | MacGregor | G01V 11/00 702/6 |
| 2010/0017354 A1 | 1/2010 | Chan et al. | |
| 2010/0023307 A1* | 1/2010 | Lee | G06F 18/2321 703/7 |
| 2010/0326669 A1 | 12/2010 | Zhu et al. | |
| 2011/0292764 A1* | 12/2011 | Kelly | G01V 1/307 367/38 |
| 2013/0262069 A1 | 10/2013 | Leonard | |
| 2014/0052378 A1 | 2/2014 | Muscio et al. | |
| 2014/0114576 A1* | 4/2014 | Jain | G01V 3/32 702/9 |
| 2015/0094994 A1 | 4/2015 | Sequeira, Jr. et al. | |
| 2016/0146960 A1* | 5/2016 | Steckhan | G01V 1/308 702/18 |
| 2017/0235015 A1 | 8/2017 | Dhont et al. | |
| 2017/0364795 A1* | 12/2017 | Anderson | G06N 20/10 |
| 2018/0068083 A1* | 3/2018 | Cohen | G16B 50/30 |
| 2018/0112498 A1 | 4/2018 | Hinkley et al. | |

FOREIGN PATENT DOCUMENTS

| | | | | |
|---|---|---|---|---|
| FR | 2991463 A1 * | 12/2013 | | G01V 1/303 |
| FR | 3036518 A1 * | 11/2016 | | G01V 99/00 |
| FR | 3037682 A1 * | 12/2016 | | G06F 30/20 |
| FR | 3043481 A1 * | 5/2017 | | G01V 1/30 |
| WO | WO 2001016880 A2 * | 3/2001 | | G06F 15/18 |
| WO | WO 02066964 A2 * | 8/2002 | | G01N 21/359 |
| WO | WO 2017016895 A1 * | 2/2017 | | |

OTHER PUBLICATIONS

Barron, E.J. "Climate and Lacustrine Petroleum Source Prediction. In B.J. Katz (Eds.), Lacustrine Basin Exploration: Case Studies and Modern Analogs", AAPG Memoir No. 50, 1990, p. 1-18.

Ziegler, et al. "Coal, climate and terrestrial productivity: the present and early Cretaceous compared. In A.C. Scott (Eds.), Coal and Coal-bearing strata: Recent advances", Geological Society of London—Special Publications No. 32, 1987, p. 25-49.

Craggs, et al. "Climate model predictions for the latest Cretaceous: An evaluation using climatically sensitive sediments as proxy indicators". Palaeogeography, Palaeoclimatology, Palaeoecology, 2012, v. 315-316, p. 12-23.

Scotese, et al. "Using Paleoclimate Models to Predict Source Rock Occurrence: Some Results of the GANDOLPH Project", Search and Discovery Article #40287 (2008), 61 pgs.

AAPG Wiki, "Petroleum exploration", AAPG Wiki, https://wiki.aapg.org/index.php?title=Petroleum_exploration&oldid=26884, Apr. 17, 2019.

petgeo.weebly.com, "Exploration Techniques", petgeo.weebly.com, https://web.archive.org/web/20181017034226/https://petgeo.weebly.com/exploration-techniques.html, Oct. 17, 2018.

* cited by examiner

METHOD FOR GENERATING PREDICTIVE CHANCE MAPS OF PETROLEUM SYSTEM ELEMENTS

CROSS-REFERENCE TO RELATED APPLICATIONS

This application is a Continuation of International Application No. PCT/US2018/031672, filed May 8, 2018, which is hereby incorporated by reference in its entirety.

BACKGROUND

When exploring for hydrocarbons in frontier basins or plays, being able to meaningfully predict the presence and quality of petroleum systems elements is important. Traditionally Earth system models have been used to assist this prediction by generating definitive "yes" or "no" predictions about the presence of the petroleum systems elements. That is, the methods provide a "drill here" solution for an operator to encounter source rocks. These traditional methods often fail to account for uncertainties in the model inputs and Earth system simulations. Without accounting for such uncertainties, the traditional methods offer an operator a false level of precision with the predictions. Further, the "yes" or "no" definitive predictions do not provide a prediction that is consistent with the level of precision permitted by the modeling technique.

BRIEF DESCRIPTION OF THE DRAWINGS

Illustrative embodiments of the present disclosure are described in detail below with reference to the attached drawings, which are incorporated by reference herein, and wherein.

The illustrated figures are only exemplary and are not intended to assert or imply any limitation with regard to the environment, architecture, design, or process in which different embodiments may be implemented.

DETAILED DESCRIPTION

In the following detailed description of the illustrative embodiments, reference is made to the accompanying drawings that form a part hereof. These embodiments are described in sufficient detail to enable those skilled in the art to practice the disclosed subject matter, and it is understood that other embodiments may be utilized and that logical structural, mechanical, electrical, and chemical changes may be made without departing from the spirit or scope of the disclosure. To avoid detail not necessary to enable those skilled in the art to practice the embodiments described herein, the description may omit certain information known to those skilled in the art. The following detailed description is, therefore, not to be taken in a limiting sense, and the scope of the illustrative embodiments is defined only by the appended claims.

As used herein, the singular forms "a", "an," and "the" are intended to include the plural forms as well, unless the context clearly indicates otherwise. It will be further understood that the terms "comprise" and/or "comprising," when used in this specification and/or the claims, specify the presence of stated features, steps, operations, elements, and/or components, but do not preclude the presence or addition of one or more other features, steps, operations, elements, components, and/or groups thereof. In addition, the steps and components described in the embodiments and figures are merely illustrative and do not imply that any particular step or component is a requirement of a claimed embodiment.

The present disclosure is related to chance maps and, in particular, to methods of generating predictive chance maps of petroleum system elements. The present disclosure describes improved methods of generating and displaying the predictive maps. In some embodiments, the predictive chance maps visually depict the likelihood of encountering a feature of interest at illustrated geographical locations. The resulting predictive chance maps use a range of parameters to generate. The methods disclosed herein may be suitable for predicting the presence of a feature of interest in hydrocarbon exploration. It will be appreciated, however, that the methods described herein are equally applicable to predicting the presence of geological features for purposes unrelated to hydrocarbon exploration.

As used herein, the term "feature of interest" refers to a feature that may influence the presence of producible hydrocarbons. The feature of interest may be a hydrocarbon source rock, a rock that can seal a hydrocarbon trap, hydrocarbon reservoir presence, or other features that may influence the likelihood of finding hydrocarbons in a certain geographical area.

Figure 1:
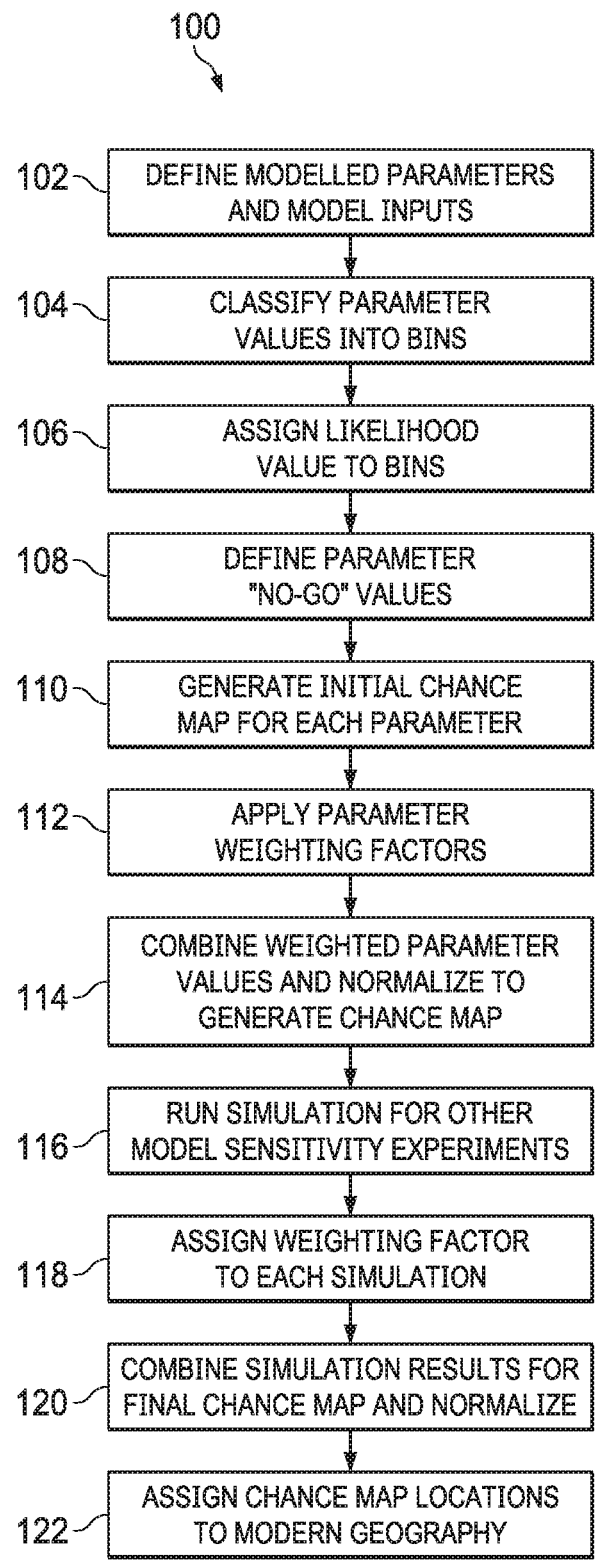
FIG. 1 is a flowchart of a method for generating a final chance map, in accordance with an embodiment of the disclosure.

Referring to FIG. 1, a flowchart of a method 100 for generating a final chance map visually indicative of a likely distribution of a feature of interest to petroleum exploration is illustrated. Initially, at block 102, modelled parameters and model inputs are defined for the feature of interest for which a chance map is to be produced. The modelled parameters and model inputs may be collectively referred to as modelled parameters.

The modelled parameters may vary depending on the specific feature of interest to be represented in the final chance map. A feature of interest may be predicted by a set of modelled parameters such as annual mean temperatures, ocean currents direction and strength, mean annual rainfall, coldest month mean temperature, warmest month mean temperature, water depth, mean annual sediment yield, number of seasons with upwelling or mean oxygen levels in water, or any combination thereof at a geographical location. The predictions of the features of interest may rely on a small number of modelled parameters (e.g. four), or the predictions may rely on twelve, thirteen, or more modelled parameters. The model parameters may be prescribed or determined through the use of machine learning or principal component analysis. Additionally, the features of interest may include the presence of aeolian dunes, evaporites, coals, karst, permafrost, organic matter preservation, marine productivity, marine source rocks, tropical carbonates, or any other features that may be of interest when exploring for hydrocarbons.

At block 104, modelled parameter values may be classified into data bins. The data bins may each represent a range of modelled parameter values that are associated with a likelihood that the range of modelled parameter values will result in the feature of interest. The likelihood values may be assigned to the data bins at block 106. The likelihood values may be a numeric representation of the likelihood of finding a feature of interest at a geographical location based on the modelled parameter value. For example, a modeled average temperature between 20 degrees Celsius and 22 degrees Celsius during a time period of interest (e.g., the Early Jurassic period) may indicate that a feature of interest in a geographical area is likely (e.g., approximately 75% likelihood), while a modeled average temperature more than 22 degrees Celsius during the time period of interest may indicate that a feature of interest in a geographical area is highly likely (e.g., approaching a 100% likelihood). Each modelled parameter may include several data bins. In an embodiment, the data bins may include a highly likely data bin (e.g., approximately 100% likelihood), a likely data bin (e.g., approximately 75% likelihood), a possible data bin (e.g., approximately 50% likelihood), an unlikely data bin (e.g., approximately 25% likelihood), and a highly unlikely data bin (e.g., approximately 0% likelihood). The data bins may be determined based on known data points or based on machine learning or principal component analysis.

Similar to the data bins, a "no-go" value of a parameter may also be established at block 108. That is, the modelled parameter may have a certain range of values that preclude the feature of interest from occurring altogether. As an example, in an embodiment, a modeled average temperature greater than 30 degrees Celsius during a specific time period in a geographical location may make it impossible for a feature of interest to be located in the geographical location. The no-go value of a parameter may also be established through known data points or through machine learning or principal component analysis.

Using the modelled parameter values and the assigned bins of the modelled parameter values, an initial chance map is generated at block 110 for each modelled parameter. As an example, the initial chance map may map the geographical locations of each parameter value data bin. In an embodiment with five data bins and a no-go value, the initial chance map may include six different shades to denote geographical locations of each data bin and the no-go value of the modelled parameter. Alternatively the chance map may be displayed using a continuous scale without any bins.

Once the initial chance maps are generated for each modelled parameter, parameter weighting factors are applied to each of the initial chance maps at block 112. The weighting factor accounts for parameters that may have a greater influence than the other parameters on a likelihood of the feature of interest being present. The weighting factors may be prescribed or determined through machine learning or principal component analysis.

At block 114, the weighted chance maps of each parameter are combined and normalized to generate a simulation chance map. The simulation chance map provides a visual indication of the likelihood of the presence of a feature of interest based on all of the modelled parameters. Similar to the initial chance map, the simulation chance map may also provide a number of color shades that correspond to the data bins and no-go values established in blocks 106 and 108, respectively.

At block 116, other sensitivity models are run to generate additional simulation chance maps. The other sensitivity models may be identical to blocks 102-114, but the other sensitivity models may account for sensitivity differences, such as varying levels of atmospheric carbon dioxide levels. Other uncertainties may also be modeled such as solar radiation, orbital configuration, paleobathymetry and sediment yield.

Weighting factors may be assigned at block 118 to each of the simulation chance maps generated at block 116. The weighting factors may be prescribed or assigned based on machine learning or principal component analysis. By way of example, some simulation chance maps may be known to be more accurate than other simulation chance maps based on observed data when actually encountering the feature of interest. Accordingly, those more accurate chance maps may have a greater influence on a final chance map.

At block 120, the weighted simulation chance maps are combined to generate a final chance map. The final chance map shows the likelihood of finding a feature of interest at a geographical location based on each of the simulations performed for the groups of modelled parameters. Because of tectonic movement since the time period of interest of the modelled parameters, at block 122 the final chance map locations may be assigned to modern day geographical locations. By way of example, a Jurassic model, which lacks the Atlantic Ocean, would be mapped to a modern day map that includes the Atlantic Ocean. Such an assignment may be used for ease of use in present day hydrocarbon exploration.

Figures 2, 3:
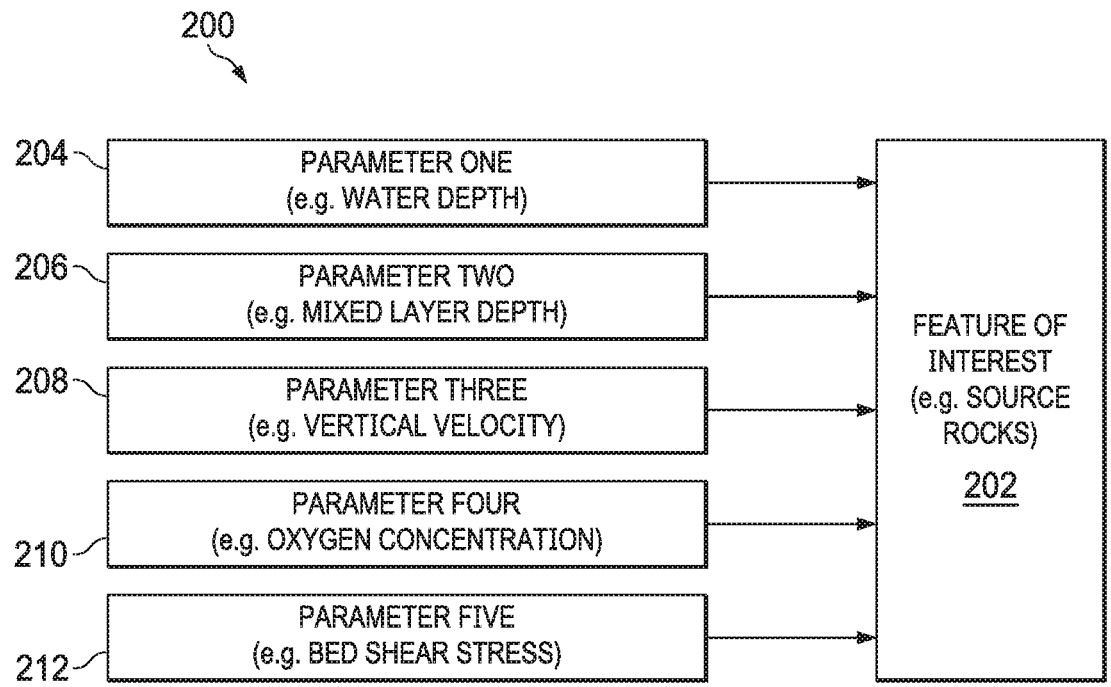
FIG. 2 is a diagram illustrating example parameters used to predict a feature of interest, in accordance with an embodiment of the disclosure.
FIG. 3 is a chart showing bins of an example parameter used in the method of FIG. 1, in accordance with an embodiment of the disclosure.

FIG. 2 is a diagram 202 illustrating modelled parameters 204-212 that are used to predict a location of a feature of interest 202. The modelled parameters 204-212 may be a group of historic environmental conditions experienced at a geographic location. In an embodiment, a feature of interest may be predicted based on three or four modelled parameters 204-212, while in other embodiments a feature of interest may be predicted based on twelve or more modelled parameters 204-212. As illustrated, the feature of interest 202 may be the presence of source rocks. Values of the modelled parameter 204 indicating a water depth, the modelled parameter 206 indicating a mixed layer depth, the modelled parameter 208 indicating a vertical velocity, the modelled parameter 210 indicating an oxygen concentration, and the modelled parameter 212 indicating a bed shear stress may all be used as predictors of the presence of a source rock feature of interest 202. The modelled parameters 204-212 for the feature of interest 202 may be identified at block 102 of the method 100 for generating a final chance map indicative of a likely distribution of the feature of interest 202.

Turning now to FIG. 3, illustrated is a chart 300 showing data bins of an example of a modelled parameter used in the method 100. A data bin column 302 depicts an indication of modelled parameter value ranges of an example modelled parameter. As illustrated, the data bins for the example modelled parameter include ranges of less than 20, from 20 to 22, from 22 to 24, from 24 to 26, greater than 26, and greater than 30. These values may represent a temperature value or any other usable modelled parameter metric. An impact column 304 provides an indication of likelihood of the presence of a feature of interest at the data bins of the data bin column 302. As illustrated, the impact column 304 includes a highly likely probability, a likely probability, a possible probability, an unlikely probability, a highly unlikely probability, and an impossible probability.

Each of the impacts from the impact column 304 may be assigned likelihood values in a value applied column 306. The likelihood value applied in the value applied column 306 may be a numeric representation of a percentage likelihood of the presence of the feature of interest and the specified data bin ranges of the data bin column 302. As illustrated, the values may range from 0 to 1 where 0 represents highly unlikely (i.e., approximately 0% likelihood) and 1 represents highly likely (i.e., approximately 100% likelihood). Intermediate values may also be used for the likely, possible, and unlikely data bins (e.g., 0.75, 0.5, and 0.25, respectively).

In some embodiments, an impossible data bin may be established. As illustrated, the impossible data bin occurs when the example parameter value is greater than 30. In such an instance, this value range indicates that a feature of interest will never be present when the modelled parameter values are in the impossible data bin range. The value applied in the value applied column 306 is listed as "no-go," which results in a zero chance indication of the feature of interest in the final chance map. This differs from the highly unlikely data bin in that the impossible data bin precludes the possibility of the feature of interest being located in a geographical area regardless of what the other modelled parameters may indicate. In contrast, a geographical location with a parameter value in the highly unlikely data bin range may still include a feature of interest when the other parameters indicate a high likelihood of the presence of the feature of interest in the geographical area. The data bin column 302, the impact column 304, and the value applied column 306 may all be established at blocks 104-108 of the method 100 described above with respect to FIG. 1. Establishment of the values associated with the chart 300 may result from information collected from known locations, machine learning, and/or principal component analysis.

Figure 4:
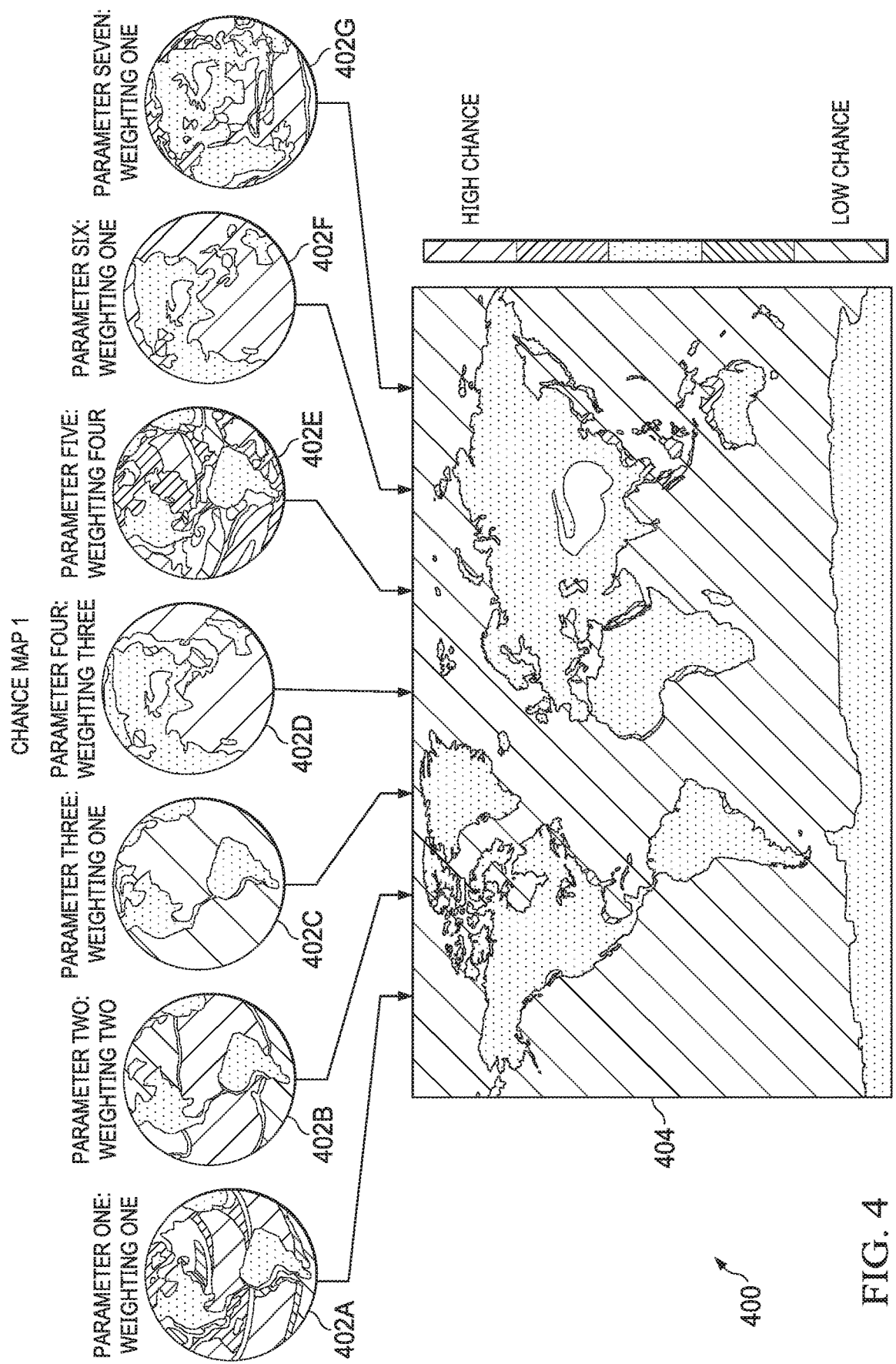
FIG. 4 is a diagram illustrating parameter weighting of initial chance maps to generate a simulation chance map, in accordance with an embodiment of the disclosure.

FIG. 4 is a diagram 400 illustrating parameter weighting of initial chance maps 402A-402G to generate a simulation chance map 404. As discussed above with respect to FIG. 1, weighted parameter values generate the initial chance maps 402A-402G. As illustrated, each of the initial chance maps 402A-402G are further weighted based on the impact of the individual modelled parameters on the likelihood of encountering the feature of interest. By way of example, temperature may play a more significant role than water depth in an embodiment. Accordingly, the initial chance map 402E may represent temperature and include a weighting value of 4, while the initial chance map 402C may represent water depth and include a weighting value of 1.

The initial chance maps 402A-402G are weighted, combined, and normalized to generate the simulation chance map 404. The simulation chance map 404 provides a visual indication of a likelihood of encountering a feature of interest based on the modelled parameters used to generate the initial chance maps 402A-402G. While seven modelled parameters are used to generate the initial chance maps 402A-402G and the simulation chance map 404, more or fewer modelled parameters are also within the scope of the present disclosure for use in generating the simulation chance map 404. The simulation chance map may be displayed for a specific time period specific representation of Earth, such as the Early Jurassic period, or other embodiments may un-reconstruct the simulation chance map 404 to a modern geographical representation of Earth.

In an embodiment, a feature of interest may be influenced by groups of parameters that provide mutually exclusive control over the prediction of the feature of interest. For example, in the prediction of source rock distribution, biological productivity, organic matter preservation, and dilution of organic matter by non-organic sediment provide mutually exclusive control over the prediction. Accordingly, all of the modelled parameters that have an effect on biological productivity are considered separately from other modelled parameters that have an effect on organic matter preservation or dilution of organic matter by non-organic sediment. An additional layer of weighting may then be applied to each of the groups (i.e., biological productivity, organic matter preservation, and dilution of organic matter) based on which groups are more or less likely to have an effect on the feature of interest. The additional layer of weighting may be prescribed or determined through machine learning or principal component analysis.

Figure 5:
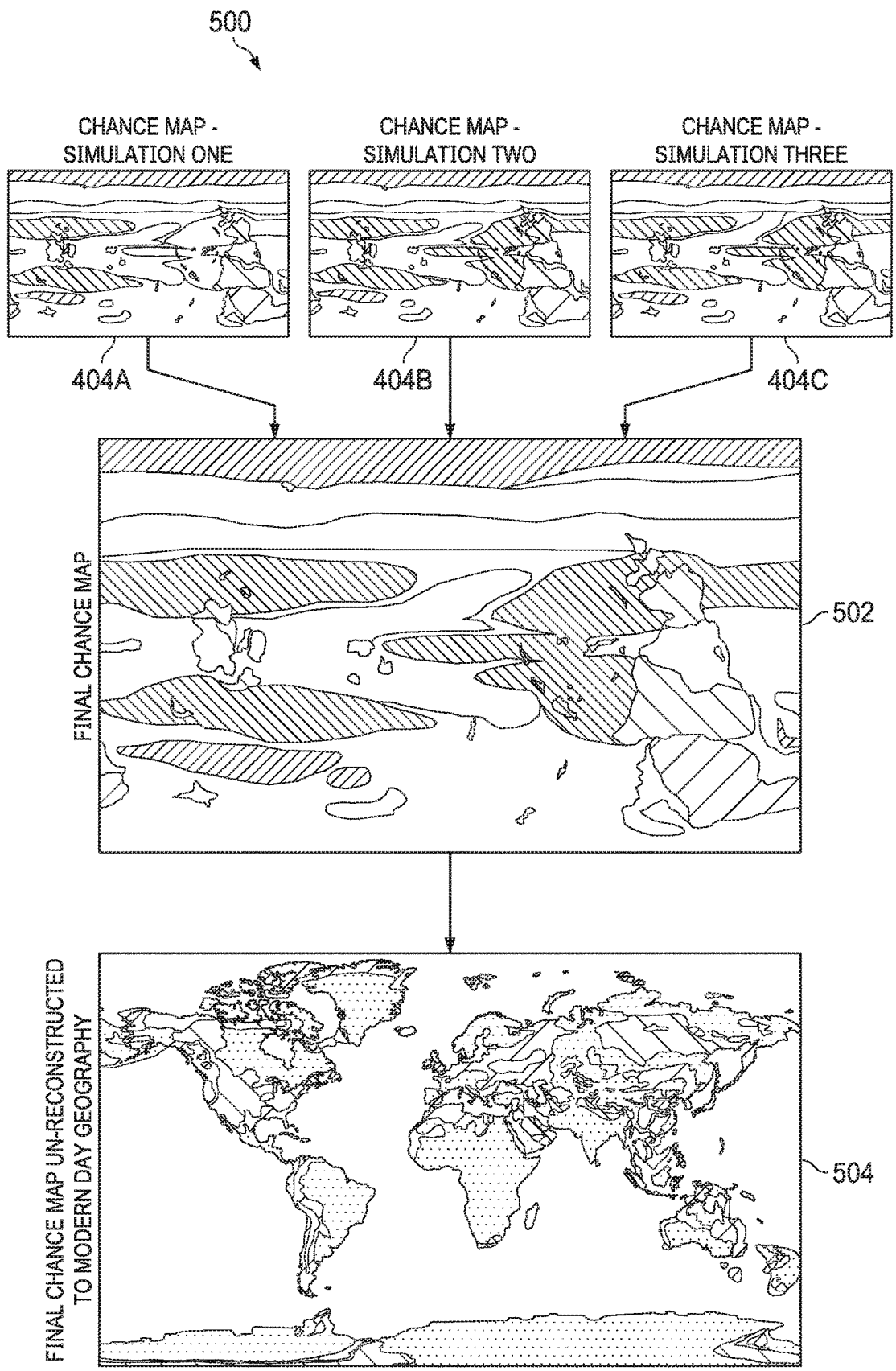
FIG. 5 is a diagram illustrating a combination of simulation chance maps to generate a final chance map, in accordance with an embodiment of the disclosure.

Turning to FIG. 5, a diagram 500 is depicted illustrating a combination of simulation chance maps 404A-404C used to generate a final chance map 502. As discussed above with respect to block 116 of the method 100, multiple simulations may be run to generate multiple simulation chance maps 404A-404C that account for differences in model sensitivity. For example, the simulation chance maps 404A-404C may each represent the likelihood of encountering a feature of interest when different atmospheric carbon dioxide levels are accounted for during the time period of interest of the modelled parameters. Other uncertainties may also be modeled to generate the different simulation chance maps 404A-404C.

Once the simulation chance maps 404A-404C are generated, the simulation chance maps 404A-404C may be weighted based on a likelihood that the conditions relating to a specific simulation were present during the period of interest. For example, a simulation with a greater atmospheric carbon dioxide level than a simulation using present day carbon dioxide levels may have a greater weight when aggregating the simulation chance maps 404A-404C. The weighting levels may be based on known data, machine learning, or principal component analysis. In combining the weighted simulation chance maps 404A-404C, the final chance map 502 provides a visual indication of the likelihood of encountering a specific feature of interest in a geographical location.

Because the time period of interest used for modelling the modelled parameters may include a different geography from modern geography, the likelihoods illustrated in the final chance map 502 may be assigned to modern geographies in a modern geography chance map 504. The modern geography chance map 504 may enable the method 100 described above to be directly implemented in existing exploration workflows. Further, the modern geography chance map 504 provides a visual indication of the likelihood of encountering a feature of interest that is easily readable by an entire exploration team and not limited to a handful of experts.

The exemplary methodologies described herein may be implemented by a system including processing circuitry or a computer program product including instructions which, when executed by at least one processor, causes the processor to perform any of the methodology described herein.

The above-disclosed embodiments have been presented for purposes of illustration and to enable one of ordinary skill in the art to practice the disclosure, but the disclosure is not intended to be exhaustive or limited to the forms disclosed. Many insubstantial modifications and variations will be apparent to those of ordinary skill in the art without departing from the scope and spirit of the disclosure. For instance, although the flowcharts depict serial processes, some of the steps/processes may be performed in parallel or out of sequence, or combined into a single step/process. The scope of the claims is intended to broadly cover the disclosed embodiments and any such modification. Further, the following clauses represent additional embodiments of the disclosure and should be considered within the scope of the disclosure:

Clause 1, a non-transitory computer readable medium comprising a set of instructions that in operation causes a processor to: determine at least one modelled parameter of a feature of interest in petroleum exploration; assign likelihood value to each modelled parameter of the at least one modelled parameter; generate an initial chance map for each modelled parameter of the at least one modelled parameter; assign weighting factor for each modelled parameter of the at least one modelled parameter; and combine the initial chance maps using the weighting factor for each modelled parameter of the at least one modelled parameter to generate a first simulation chance map.

Clause 2, the computer readable medium of clause 1, comprising instructions that in operation cause the processor to: generate a second simulation chance map; apply a first simulation weighting factor to the first simulation chance map and a second simulation weighting factor to the second simulation chance map; and generate a final chance map based on a weighted combination of the first simulation chance map and the second simulation chance map.

Clause 3, the computer readable medium of clause 1 or 2, wherein the first simulation chance map and the second simulation chance map are generated based on different model sensitivities.

Clause 4, the computer readable medium of at least one of clauses 1-3, wherein the model sensitivities are based on atmospheric carbon dioxide levels.

Clause 5, the computer readable medium of at least one of clauses 1-4, comprising instructions that in operation cause the processor to: assign locations of the final chance map to modern geographical locations.

Clause 6, the computer readable medium of at least one of clauses 1-5, wherein the first simulation chance map depicts a visual of a likelihood distribution of the feature of interest related to a petroleum system element.

Clause 7, the computer readable medium of at least one of clauses 1-6, wherein the feature of interest comprises source rock, seals, reservoir presence, or any combination thereof.

Clause 8, the computer readable medium of at least one of clauses 1-7, wherein the at least one modelled parameter comprises temperature, ocean currents, rainfall, or any combination thereof.

Clause 9, the computer readable medium of at least one of clauses 1-8, wherein the first simulation chance map provides an indication of a percentage chance of finding the feature of interest at a geographic location.

Clause 10, the computer readable medium of at least one of clauses 1-9, wherein the likelihood value is determined through machine learning or principal component analysis.

Clause 11, one or more storage devices storing instructions that are executable to perform operations comprising: determining a set of modelled parameters of a feature of interest in petroleum exploration; generating a first simulation chance map based on the set of modelled parameters at a first sensitivity model; generating a second simulation chance map based on the set of modelled parameters at a second sensitivity model; assigning a first weighting factor to the first simulation chance map to generate a weighted first simulation chance map; assigning a second weighting factor to the second simulation chance map to generate a weighted second simulation chance map; and combining the weighted first simulation chance map with the weighted second simulation chance map to generate the final chance map.

Clause 12, the one or more storage devices of clause 11 storing instructions comprising: assigning locations of the final chance map to modern geographical locations.

Clause 13, the one or more storage devices of clause 11 or 12, wherein the first sensitivity model and the second sensitivity model differ based on atmospheric carbon dioxide concentrations.

Clause 14, the one or more storage devices of at least one of clauses 11-13, wherein the feature of interest comprises source rock, hydrocarbon seal rock, reservoir presence, or any combination thereof.

Clause 15, the one or more storage devices of at least one of clauses 11-14, wherein the final chance map depicts a percentage chance of finding the feature of interest at a geographic location.

Clause 16, A non-transitory computer readable medium comprising a set of instructions that in operation cause a processor to: define modelled parameters that influence a likelihood of the presence of a feature of interest; classify values of the modelled parameters into data bins; assign numeric representations of likelihood to the data bins; generate initial chance maps for each of the modelled parameters; apply parameter weighting factors to each of the initial chance maps; and combine weighted initial chance maps to generate a first simulation chance map.

Clause 17, the computer readable medium of clause 16, wherein the set of instructions cause the processor to: generate a second simulation chance map; generate a third simulation chance map; apply a first simulation weighting factor to the first simulation chance map, a second simulation weighting factor to the second simulation chance map, and a third weighting factor to the third simulation chance map; and generate a final chance map based on a weighted combination of the first simulation chance map, the second simulation chance map, and the third simulation chance map.

Clause 18, the computer readable medium of clause 16 or 17, wherein the set of instructions cause the processor to: assign locations of the final chance map to modern geographical locations.

Clause 19, the computer readable medium of at least one of clauses 16-18, wherein the modelled parameters comprise a coldest month mean temperature, a warmest month mean temperature, a water depth, a mean annual sediment yield, a mean annual vertical velocity, a seasonal peak of Ekman suction, a number of seasons with Ekman suction, a seasonal peak of upwelling, a number of seasons with upwelling, or any combination thereof.

Clause 20, the computer readable medium of at least one of clauses 16-19, wherein the numeric representation of likelihood comprises a number between 0 and 1, where a value of 0 indicates a scenario is highly unlikely and a value of 1 indicates a scenario is highly likely.

While this specification provides specific details related to generating predictive chance maps of petroleum systems elements, it may be appreciated that the list of components is illustrative only and is not intended to be exhaustive or limited to the forms disclosed. Other components related to the predictive chance maps will be apparent to those of ordinary skill in the art without departing from the scope and spirit of the disclosure. Further, the scope of the claims is intended to broadly cover the disclosed components and any such components that are apparent to those of ordinary skill in the art.

It should be apparent from the foregoing disclosure of illustrative embodiments that significant advantages have been provided. The illustrative embodiments are not limited solely to the descriptions and illustrations included herein and are instead capable of various changes and modifications without departing from the spirit of the disclosure.

What is claimed is:

1. A non-transitory computer readable medium comprising a set of instructions that in operation cause a processor to:
   determine at least one modelled parameter of a feature of interest in petroleum exploration;
   assign a likelihood value to each modelled parameter of the at least one modelled parameter, wherein the likelihood value is a numeric representation of a likelihood of finding the feature of interest at a geographical location based on the at least one modelled parameter, and wherein the likelihood value for each modelled parameter is assigned based on machine learning;
   generate an initial chance map for each modelled parameter of the at least one modelled parameter;
   assign a weighting factor for each modelled parameter of the at least one modelled parameter, wherein the weighting factor for each modelled parameter is assigned based on machine learning of the modelled parameter; and
   combine the initial chance maps using the weighting factor for each modelled parameter of the at least one modelled parameter and a weighting of each initial chance map based on an impact of the respective modeled parameter on a likelihood of encountering the feature to generate a first simulation chance map.

2. The computer readable medium of claim 1 comprising instructions that in operation cause the processor to:
   generate a second simulation chance map;
   apply a first simulation weighting factor to the first simulation chance map and a second simulation weighting factor to the second simulation chance map; and
   generate a final chance map based on a weighted combination of the first simulation chance map and the second simulation chance map.

3. The computer readable medium of claim 2, wherein the first simulation chance map and the second simulation chance map are generated based on different model sensitivities.

4. The computer readable medium of claim 3, wherein the model sensitivities are based on atmospheric carbon dioxide levels, orbital configuration, solar input or topography.

5. The computer readable medium of claim 2 comprising instructions that in operation cause the processor to:
   assign locations of the final chance map to modern geographical locations.

6. The computer readable medium of claim 1, wherein the first simulation chance map depicts a visual of a likelihood distribution of the feature of interest related to a petroleum system element.

7. The computer readable medium of claim 1, wherein the feature of interest comprises source rock, hydrocarbon seal rock, reservoir presence, or any combination thereof.

8. The computer readable medium of claim 1, wherein the at least one modelled parameter comprises temperature, ocean currents, rainfall, or any combination thereof.

9. The computer readable of claim 1, wherein the first simulation chance map provides an indication of a chance of finding the feature of interest at a geographic location.

10. The computer readable medium of claim 1, wherein the likelihood value is determined through machine learning or principal component analysis.

11. One or more storage devices storing instructions that are executable to perform operations comprising:
    determining a set of modelled parameters of a feature of interest in petroleum exploration;
    assigning a likelihood value to each modelled parameter of the at least one modelled parameter, wherein the likelihood value is a numeric representation of a likelihood of finding the feature of interest at a geographical location based on the at least one modelled parameter, and wherein the likelihood value for each modelled parameter is assigned based on machine learning;
    generating a first simulation chance map based on the set of modelled parameters at a first sensitivity model;
    generating a second simulation chance map based on the set of modelled parameters at a second sensitivity model;
    assigning a first weighting factor to the first simulation chance map to generate a weighted first simulation chance map, wherein the first weighting factor is assigned based on machine learning of the set of modelled parameters;
    assigning a second weighting factor to the second simulation chance map to generate a weighted second simulation chance map, wherein the second weighting factor is assigned based on machine learning of the set of modelled parameters;
    further weighting the weighted first simulation chance map and the weighted second simulation chance map based on an impact of the set of modeled parameters on a likelihood of encountering the feature of interest; and
    combining the weighted first simulation chance map with the weighted second simulation chance map to generate the final chance map.

12. The one or more storage devices of claim 11 storing instructions comprising:
    assigning locations of the final chance map to modern geographical locations.

13. The one or more storage devices of claim 11, wherein the first sensitivity model and the second sensitivity model differ based on atmospheric carbon dioxide levels, orbital configuration, solar input or topography.

14. The one or more storage devices of claim 11, wherein the feature of interest comprises source rock, seals, reservoir presence, or any combination thereof.

15. The one or more storage devices of claim 11, wherein the final chance map depicts a percentage chance of finding the feature of interest at a geographic location.

16. A non-transitory computer readable medium comprising a set of instructions that in operation cause a processor to:
    define modelled parameters that influence a likelihood of the presence of a feature of interest;
    classify values of the modelled parameters into data bins;
    assign numeric representations of likelihood to the data bins;
    assign a likelihood value to each modelled parameter of the modelled parameters, wherein the likelihood value is a numeric representation of a likelihood of finding the feature of interest at a geographical location based on the modelled parameters, and wherein the likelihood value for each modelled parameter is assigned based on machine learning;
    generate initial chance maps for each of the modelled parameters;
    apply parameter weighting factors to each of the initial chance maps;

further weighting each of the initial chance maps based on an impact of a respective modeled parameter of the modelled parameters on a likelihood of encountering the feature of interest; and combine weighted initial chance maps to generate a first simulation chance map.

17. The computer readable medium of claim 16, wherein the set of instructions causes the processor to:

generate a second simulation chance map;

generate a third simulation chance map;

apply a first simulation weighting factor to the first simulation chance map, a second simulation weighting factor to the second simulation chance map, and a third weighting factor to the third simulation chance map; and generate a final chance map based on a weighted combination of the first simulation chance map, the second simulation chance map, and the third simulation chance map.

18. The computer readable medium of claim 16, wherein the set of instructions causes the processor to:

assign locations of the final chance map to modern geographical locations.

19. The computer readable medium of claim 16, wherein the modelled parameters comprise a coldest month mean temperature, a warmest month mean temperature, a water depth, a mean annual sediment yield, a mean annual vertical velocity, a seasonal peak of Ekman suction, a number of seasons with Ekman suction, a seasonal peak of upwelling, a number of seasons with upwelling, or any combination thereof.

20. The computer readable medium of claim 16, wherein the numeric representation of likelihood comprises a number between 0 and 1, where a value of 0 indicates a scenario is highly unlikely and a value of 1 indicates a scenario is highly likely.

* * * * *